(12) United States Patent
Sato et al.

(10) Patent No.: US 8,777,695 B2
(45) Date of Patent: Jul. 15, 2014

(54) ULTRASONIC CLEANING APPARATUS, ULTRASONIC CLEANING METHOD, AND STORAGE MEDIUM STORING COMPUTER PROGRAM FOR EXECUTING ULTRASONIC CLEANING METHOD

(75) Inventors: Hideaki Sato, Koshi (JP); Kazuyoshi Eshima, Koshi (JP); Hiromi Hara, Koshi (JP); Hirozumi Hoshino, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 805 days.

(21) Appl. No.: 12/876,566

(22) Filed: Sep. 7, 2010

(65) Prior Publication Data

US 2011/0056512 A1      Mar. 10, 2011

(30) Foreign Application Priority Data

Sep. 8, 2009  (JP) ................................. 2009-207308

(51) Int. Cl.
*B24B 31/06* (2006.01)
*B08B 3/12* (2006.01)

(52) U.S. Cl.
USPC ............ 451/36; 451/104; 451/113; 451/326; 451/910; 134/1; 134/1.3; 134/184

(58) Field of Classification Search
USPC ........... 451/8, 10, 11, 36, 104, 113, 326, 328, 451/910; 134/1, 1.3, 184, 187, 902
See application file for complete search history.

(56) References Cited

U.S. PATENT DOCUMENTS

| | | | | | |
|---|---|---|---|---|---|
| 4,909,266 | A | * | 3/1990 | Massa | 134/60 |
| 4,919,073 | A | * | 4/1990 | Kobayashi et al. | 118/688 |
| 5,137,580 | A | * | 8/1992 | Honda | 134/1 |
| 5,625,249 | A | * | 4/1997 | Grant | 310/334 |
| 6,019,852 | A | * | 2/2000 | Pedziwiatr et al. | 134/1 |
| 6,048,405 | A | * | 4/2000 | Skrovan et al. | 134/1 |
| 6,059,886 | A | * | 5/2000 | Shibano | 134/1 |
| 6,554,003 | B1 | * | 4/2003 | Birang et al. | 134/1.3 |
| 7,108,003 | B2 | * | 9/2006 | Kitahara | 134/184 |
| 8,083,857 | B2 | * | 12/2011 | Watanabe et al. | 134/1.3 |
| 2003/0041876 | A1 | * | 3/2003 | Tsuga et al. | 134/1.3 |
| 2008/0308120 | A1 | * | 12/2008 | Watanabe et al. | 134/1 |

FOREIGN PATENT DOCUMENTS

JP       2003-209086 A1      7/2003
JP       2006-035139 A1      2/2006

* cited by examiner

*Primary Examiner* — Eileen P. Morgan
(74) *Attorney, Agent, or Firm* — Burr & Brown, PLLC

(57) ABSTRACT

An ultrasonic cleaning apparatus according to the present invention comprises a plurality of cleaning tanks configured to store a cleaning liquid, an object-to-be-processed holder capable of being inserted into each cleaning tank, the object-to-be-processed holder being configured to hold an object to be processed and to immerse the object to be processed into the cleaning liquid, a vibrator disposed on each cleaning tank, a single ultrasonic oscillator configured to make each vibrator ultrasonically vibrate, an output switch interposed between the ultrasonic oscillator and the vibrator of each respective cleaning tank, the output switch being configured to switch the vibrator that is connected to the ultrasonic oscillator, and a control device configured to control the ultrasonic oscillator and the output switch, wherein the control device controls the ultrasonic oscillator and the output switch such that a timing at which the vibrator of one of the cleaning tanks is made to ultrasonically vibrate, and a timing at which the vibrator of another cleaning tank is made to ultrasonically vibrate are not overlapped with each other.

9 Claims, 6 Drawing Sheets

ULTRASONIC CLEANING APPARATUS, ULTRASONIC CLEANING METHOD, AND STORAGE MEDIUM STORING COMPUTER PROGRAM FOR EXECUTING ULTRASONIC CLEANING METHOD

CROSS REFERENCE TO RELATED APPLICATIONS

This application is based upon and claims the benefit of priority from the prior Japanese Patent Application No. 2009-207308 filed on Sep. 8, 2009, the entire contents of which are incorporated herein by reference.

BACKGROUND OF THE INVENTION

1. Field of the Invention

The present invention relates to: an ultrasonic cleaning apparatus configured to clean an object to be processed, which is immersed in a cleaning liquid, with the use of ultrasonic waves; an ultrasonic cleaning method; and a storage medium storing a computer program for executing the ultrasonic cleaning method.

2. Description of Related Art

There has been conventionally known an ultrasonic cleaning apparatus configured to perform an ultrasonic cleaning (including a megasonic cleaning) of an object to be processed, such as a semiconductor wafer or a glass substrate for LCD, by using ultrasonic waves, with the object to be processed being immersed in a cleaning liquid such as a deionized water or a chemical liquid stored in a cleaning tank (JP2003-209086A). In the ultrasonic cleaning apparatus, a vibrator capable of generating ultrasonic vibration is attached to a bottom part of the cleaning tank, and an ultrasonic oscillator that makes the vibrator ultrasonically vibrate is connected to the vibrator.

When the object to be processed is cleaned in such an ultrasonic cleaning apparatus, the vibrator is made to ultrasonically vibrate by the ultrasonic oscillator, with the object to be processed being immersed in the cleaning liquid in the cleaning tank. Thus, the ultrasonic vibration is propagated to the cleaning liquid, so that particles adhering to the object to be processed are removed. In this manner, the object to be processed is ultrasonically cleaned.

As shown in FIG. 9, there is known an ultrasonic cleaning apparatus 100 including two cleaning tanks 101. In this case, vibrators (not shown) are disposed on bottom parts of the respective cleaning tanks 101, and ultrasonic oscillators 102 are connected to the respective vibrators. When objects to be processed are cleaned, the vibrators are made to ultrasonically vibrate in the cleaning tank 101 in which cleaning steps of the objects to be processed are carried out, by the corresponding ultrasonic oscillator 102.

SUMMARY OF THE INVENTION

When the objects to be processed are cleaned by such an ultrasonic cleaning apparatus, a time period where the one vibrator is made to ultrasonically vibrate is relatively short in general. Thus, it is not frequent that the vibrator of the one cleaning tank 101 and the vibrator of the other cleaning tank 101 are simultaneously made to ultrasonically vibrate. However, since the ultrasonic oscillator 102 is disposed for every vibrator of each cleaning tank 101, the ultrasonic cleaning apparatus 100 is unnecessarily enlarged and expensive.

The present invention has been made in view of the above circumstances. The object of the present invention is to provide: an ultrasonic cleaning apparatus including a plurality of cleaning tanks, which is of a smaller size and inexpensive; an ultrasonic cleaning method; and a storage medium storing a computer program for executing ultrasonic cleaning method.

The present invention provides an ultrasonic cleaning apparatus comprising a plurality of cleaning tanks configured to store a cleaning liquid, an object-to-be-processed holder capable of being inserted into each cleaning tank, the object-to-be-processed holder being configured to hold an object to be processed and to immerse the object to be processed into the cleaning liquid, a vibrator disposed on each cleaning tank, a single ultrasonic oscillator configured to make each vibrator ultrasonically vibrate, an output switch interposed between the ultrasonic oscillator and the vibrator of each respective cleaning tank, the output switch being configured to switch the vibrator that is connected to the ultrasonic oscillator, and a control device configured to control the ultrasonic oscillator and the output switch, wherein the control device controls the ultrasonic oscillator and the output switch such that a timing at which the vibrator of one of the cleaning tanks is made to ultrasonically vibrate, and a timing at which the vibrator of another cleaning tank is made to ultrasonically vibrate are not overlapped with each other.

In the aforementioned ultrasonic cleaning apparatus, the ultrasonic oscillator may include an oscillator body, a plurality of matching units disposed between the oscillator body and the output switch, the matching units being respectively configured to be suited for different vibrator impedances, and a matching switch interposed between the oscillator body and the respective matching units, the matching switch being configured to switch the matching unit that is connected to the oscillator body, and the control device is configured to select, with respect to the vibrator of each cleaning tank, the matching unit suitable for the vibrator impedance of the vibrator, and to control the matching switch such that, when the matching unit selected for the vibrator for generating ultrasonic vibration is different from the matching unit that is being connected to the oscillator body, the matching units are switched.

In addition, in the aforementioned ultrasonic cleaning apparatus, the control device may be configured to control the output switch and the matching switch such that the switching of the vibrators and the switching of the matching units are simultaneously carried out.

In addition, the aforementioned ultrasonic cleaning apparatus may further comprise a measuring instrument configured to measure the vibrator impedance of the vibrator of each cleaning tank, wherein the control device is configured to select the suitable matching unit based on the vibrator impedance measured by the measuring instrument.

The present invention provides an ultrasonic cleaning method comprising cleaning an object to be processed immersed in a cleaning liquid in one cleaning tank of a plurality of cleaning tanks by sending a drive signal from a single ultrasonic oscillator via an output switch to a vibrator of the one cleaning tank of the plurality of cleaning tanks on which the vibrator is disposed so as to make the vibrator ultrasonically vibrate, and cleaning an object to be processed immersed in a cleaning liquid in another cleaning tank by sending a drive signal from the ultrasonic oscillator via the output switch to the vibrator of the other cleaning tank so as to make the vibrator ultrasonically vibrate, wherein the objects to be processed are cleaned such that a timing at which the vibrator of the one cleaning tank is made to ultrasonically vibrate, and a timing at which the vibrator of the other cleaning tank is made to ultrasonically vibrate are not overlapped with each other.

In the aforementioned ultrasonic cleaning method, the ultrasonic oscillator may include an oscillator body, and a plurality of matching units disposed between the oscillator body and the output switch, the matching units being respectively configured to be suited for different vibrator impedances, the ultrasonic cleaning method further comprising selecting, with respect to the vibrator of each cleaning tank, the matching unit suitable for the vibrator impedance of the vibrator, switching the matching unit that is connected to the oscillator body when the matching unit selected for the vibrator for generating ultrasonic vibration is different from the matching unit that is being connected to the oscillator body, and after the matching units have been switched, the object to be processed is cleaned by making the vibrator ultrasonically vibrate.

In addition, in the aforementioned ultrasonic cleaning method, the switching of the vibrators and the switching of the matching units may be simultaneously carried out.

In addition, the aforementioned ultrasonic cleaning method may further comprises measuring the vibrator impedance of the vibrator of each cleaning tank, wherein when the matching unit is selected, the suitable matching unit is selected based on the measured vibrator impedance.

The present invention provides a storage medium storing a computer program for executing an ultrasonic cleaning method which comprises cleaning an object to be processed immersed in a cleaning liquid in one cleaning tank of a plurality of cleaning tanks by sending a drive signal from a single ultrasonic oscillator via an output switch to a vibrator of the one cleaning tank of the plurality of cleaning tanks on which the vibrator is disposed so as to make the vibrator ultrasonically vibrate, and cleaning an object to be processed immersed in a cleaning liquid in another cleaning tank by sending a drive signal from the ultrasonic oscillator via the output switch to the vibrator of the other cleaning tank so as to make the vibrator ultrasonically vibrate, wherein the objects to be processed are cleaned such that a timing at which the vibrator of the one cleaning tank is made to ultrasonically vibrate, and a timing at which the vibrator of the other cleaning tank is made to ultrasonically vibrate are not overlapped with each other.

According to the present invention, the output switch is controlled by the control device, so that the vibrator that is connected to the single ultrasonic oscillator is switched to the vibrator to be connected thereto. Thus, the vibrator of any one of the plurality of cleaning tanks can be made to ultrasonically vibrate by the single ultrasonic oscillator. In this case, the objects to be processed can be ultrasonically cleaned, such that a timing at which the vibrator of one of the cleaning tanks is made to ultrasonically vibrate, and a timing at which the vibrator of another cleaning tank is made to ultrasonically vibrate are not overlapped with each other. As a result, one of the vibrators of the plurality of cleaning tanks can be made to ultrasonically vibrate by the single ultrasonically oscillator, whereby the ultrasonic cleaning apparatus including the plurality of cleaning tanks can be downsized, and a price thereof can be decreased.

DETAILED DESCRIPTION OF THE INVENTION

An embodiment according to the present invention will be described herebelow with reference to the drawings. FIGS. 1 to 8 are views for explaining the embodiment of an ultrasonic cleaning apparatus, an ultrasonic cleaning method, and a storage medium storing a computer program for executing the ultrasonic cleaning method, according to the present invention.

Figure 1:
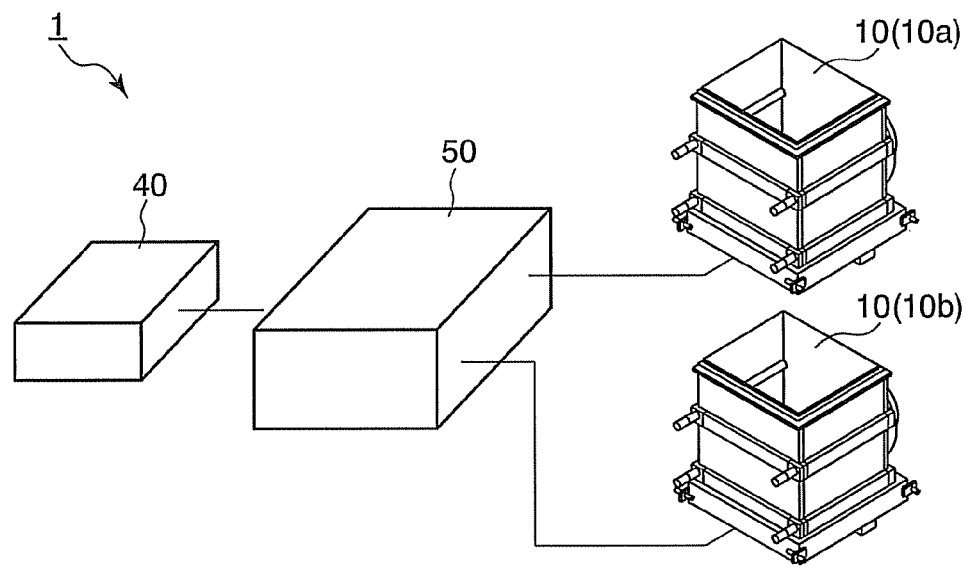
FIG. 1 is a schematic view showing an overall structure of an ultrasonic cleaning apparatus in an embodiment according to the present invention.
Figure 2:
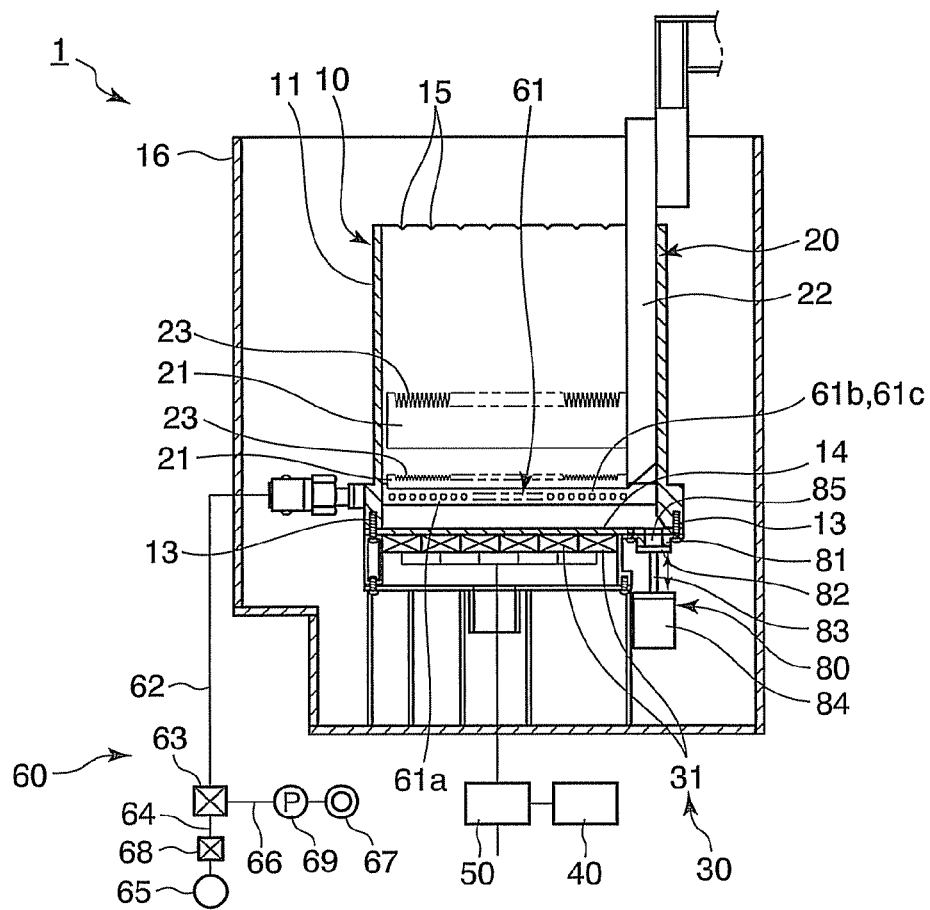
FIG. 2 is a view showing details of the ultrasonic cleaning apparatus in the embodiment according to the present invention.

With reference to FIGS. 1 and 2, an overall structure of the ultrasonic cleaning apparatus 1 is firstly described.

As shown in FIGS. 1 and 2, the ultrasonic cleaning apparatus 1 includes: two cleaning tanks 10 (a first cleaning tank 10a and a second cleaning tank 10b) configured to store a cleaning liquid (e.g., a deionized water or a chemical liquid); and a wafer board (an object-to-be-processed holder) 20 which can be inserted into each cleaning tank 10, the wafer board 20 being configured to hold an object to be processed (e.g., a semiconductor wafer, hereinafter referred to simply as "wafer W") and to immerse the wafer W into the cleaning liquid. Vibrators 30 (a first vibrator 30a and a second vibrator 30b, see, FIG. 6) are disposed on outer surfaces of bottom plates (bottom parts) 14 of the respective cleaning tanks 10. A single megasonic controller 40 including a control device 46 (see FIG. 6) is connected to the respective vibrators 30, so as to make the vibrators 30 ultrasonically vibrate. Interposed between the megasonic controller 40 and the vibrators 30 of the respective cleaning tanks 10 is an output switch 50 for switching the vibrator 30 that is connected the megasonic controller 40.

As shown in FIG. 2, each cleaning tank 10 is equipped with a cleaning-liquid supply apparatus 60 configured to supply a cleaning liquid into the cleaning tank 10, and the bottom plate 14 of each cleaning tank 10 is equipped with an exhaust valve mechanism 80 configured to discharge the cleaning liquid. Namely, each cleaning tank 10 is provided with the cleaning-liquid supply apparatus 60 and the exhaust valve mechanism 80.

Next, detailed structures of the respective components are described with reference to FIGS. 2 to 5.

Figure 3:
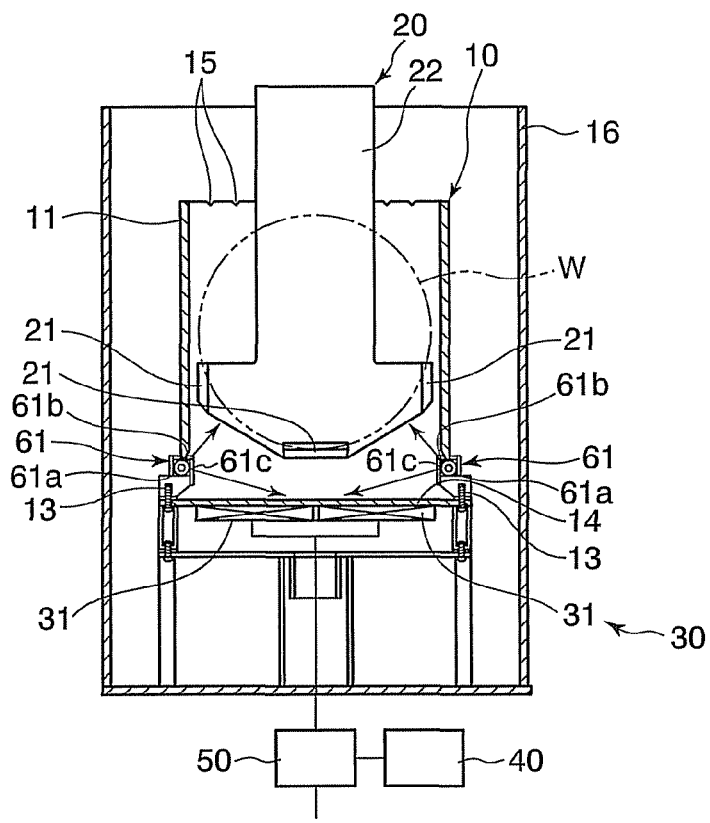
FIG. 3 is a lateral sectional view of FIG. 2.
Figure 4:
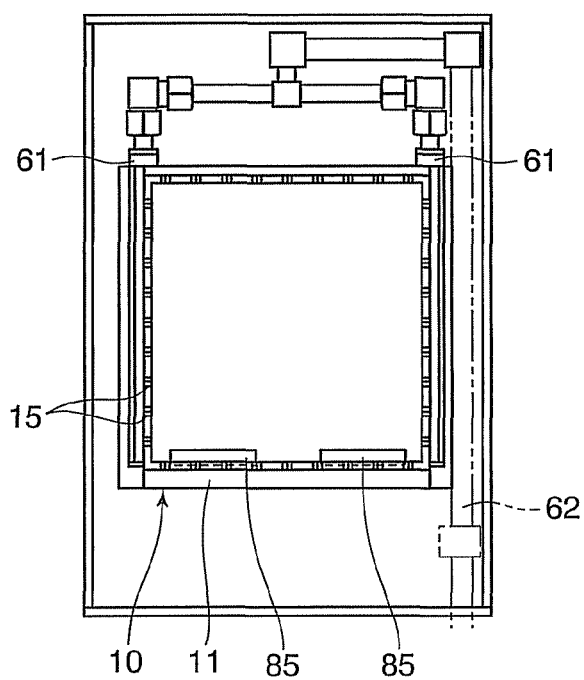
FIG. 4 is a plan view of FIG. 2.
Figure 5:
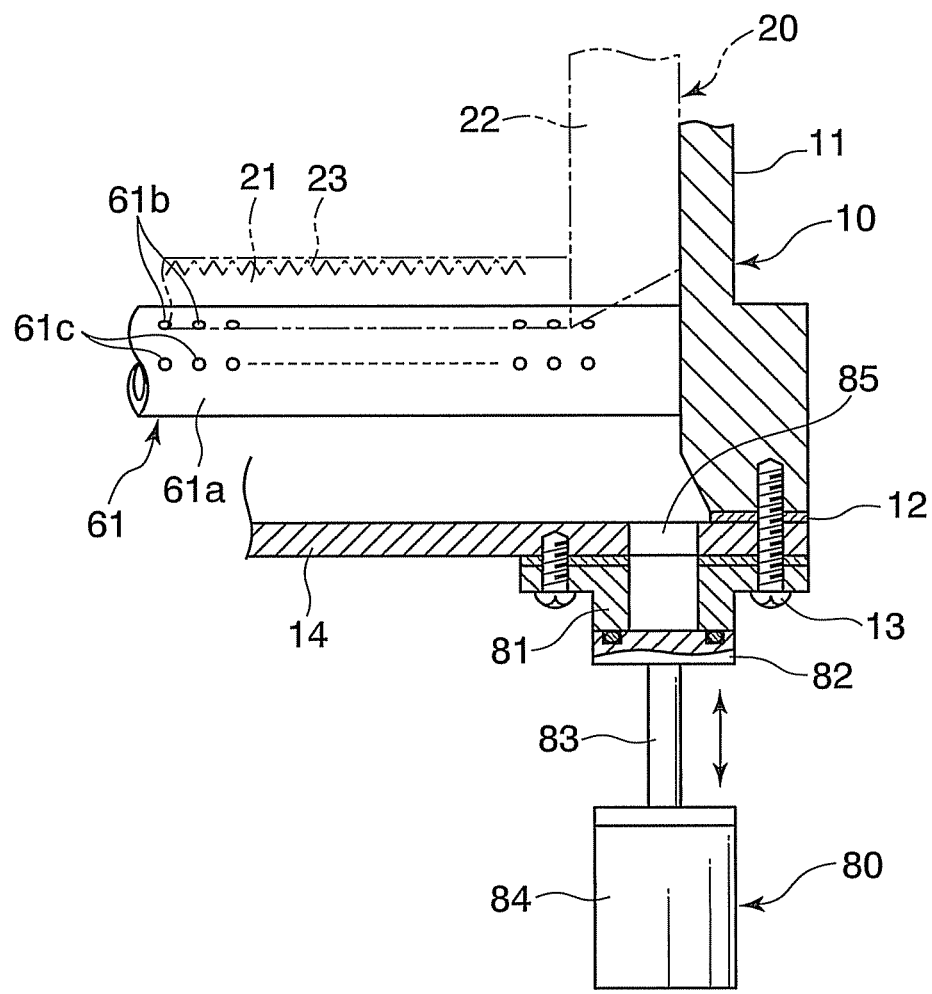
FIG. 5 is a view showing an exhaust valve mechanism in the embodiment according to the present invention.

As shown in FIGS. 2 to 5, the cleaning tank 10 is of a substantially rectangular parallelepiped shape, including four side walls 11 and the bottom plate 14 that is air-tightly and water-tightly in contact with lower ends of the respective side walls 11 through a packing 12, and is fixed thereto by fixation bolts 13 (see FIG. 5). Cut grooves 15 are formed in upper ends of the side walls 11, so that the cleaning liquid outflows from cleaning tank 10, when a liquid surface of the cleaning liquid reaches the upper ends of the side walls 11.

The side wall 11 of the cleaning tank 10 is made of a material excellent in chemical resistance, such as polytetra fluoroethylene (PTFE) or fluorine resin (PFA). The bottom plate 14 is made of a material excellent in chemical resistance and acoustic transmission, e.g., a carbon-based material such as amorphous carbon or silicon carbide. Thus, even when an ammonia hydrogen peroxide mixture, a hydrochloric acid-peroxide mixture, or dilute hydrofluoric acid, which are described below, is used as the cleaning liquid, the side walls 11 and the bottom plate 14 can be resistant to these chemical liquids. Therefore, the side walls 11 and the bottom plate 14 can be prevented from being dissolved by the cleaning liquid to generate metal contaminants or the like. In addition, as described above, since the material of the bottom plate 14 also has an acoustic transmission, the ultrasonic vibration generated by the vibrator 30 can be reliably transmitted.

Each cleaning tank 10 is accommodated in a container 16. On a bottom part of the container 16, there is disposed a pan (not shown) for collecting the cleaning liquid outflowing from the cut grooves 15 formed in the upper ends of the side walls 11 of each cleaning tank 10. The pan has a drain (not shown) for discharging the collected cleaning liquid.

As shown in FIGS. 2 and 3, the wafer board 20 includes: three holding rods 21 extending substantially horizontally, for holding a plurality of (e.g., fifty) wafers W; and a base part 22 connected to one end of each holding rod 21, and extending substantially vertically. Each holding rod 21 has a plurality of holding grooves 23 capable of being engaged with wafers W. By engaging the wafers W in the respective holding grooves 23, the wafers W can be held in a direction substantially perpendicular to the holding rod 21, i.e., in the vertical direction. An not-shown elevating mechanism is joined to the base part 22, and the control device 46 is connected to the elevating mechanism. Thus, based on a control signal from the control device 46, the elevating mechanism is configured to lower the holding rods 21 so that the wafers W are inserted into the cleaning tank 10 and immersed into the cleaning liquid, or to elevate the holding rods 21 so that the wafers W are taken out from the cleaning tank 10.

The cleaning-liquid supply apparatus 60 includes two cleaning-liquid supply nozzles 61 arranged along the opposed side walls 11 of the cleaning tank 10. Each cleaning-liquid supply nozzle 61 has a tubular nozzle body 61a extending substantially horizontally along the side wall 11 of the cleaning tank 10, and a number of first nozzle holes 61b and second nozzle holes 61c which are formed in the tubular nozzle body 61a along a longitudinal direction thereof at suitable intervals therebetween. The first nozzle holes 61b are configured to jet the cleaning liquid toward centers of the wafers W, and the second nozzle holes 61c are configured to jet the cleaning liquid toward the bottom plate 14 of the cleaning tank 10.

A selector valve 63 is connected to the cleaning-liquid supply nozzle 61 through a cleaning-liquid supply pipe 62. Connected to the selector valve 63 are a deionized-water supply source 65 through a deionized-water supply pipe 64, and a chemical-liquid supply source (a chemical liquid reservoir) 67 through a chemical-liquid supply pipe 66. The selector valve 63 is connected to the control device 46, and the control device 46 is configured to control switching of the supply pipe (the deionized-water supply pipe 64 or the chemical-liquid supply pipe 66) to be communicated with the cleaning-liquid supply pipe 62, via the selector valve 63.

The deionized-water supply pipe 64 is provided with an opening and closing valve 68 configured to regulate a flow rate of the deionized water flowing through the deionized-water supply pipe 64. The opening and closing valve 68 is connected to the control device 46, and the control device 46 is configured to control supply of the deionized water from the deionized-water supply source 65 to the cleaning tank 10 via the opening and closing valve 68.

The chemical-liquid supply pipe 66 is provided with a chemical liquid pump 69 for supplying the chemical liquid to the cleaning tank 10. The chemical liquid pump 69 is connected to the control device 46, and the control device 46 is configured to control supply of the chemical liquid from the chemical liquid reservoir 67 to the cleaning tank 10 through the chemical liquid pump 69. As the chemical liquid, an ammonia hydrogen peroxide mixture (SC1, specifically, $NH_4OH/H_2O_2/H_2O$), a hydrochloric acid-peroxide mixture (SC2, specifically, $HCl/H_2O_2/H_2O$), or dilute hydrofluoric acid (DHF) is used according to the purpose of the cleaning.

Alternatively, without using the chemical liquid pump 69, nitrogen ($N_2$) gas or the like may be supplied into the chemical liquid reservoir 67, based on a control signal from the control device 46, so as to supply the chemical liquid to the chemical-liquid supply pipe 66. In addition, the number of the chemical liquid reservoir 67 to be connected to the selector valve 63 is not limited to one, and the plurality of chemical liquid reservoirs 67 may be connected to the selector valve 63. In this case, plural kinds of chemical liquids can be supplied to the cleaning tank 10.

As, shown in FIGS. 4 and 5, the bottom plate 14 of the cleaning tank 10 is provided with two exhaust valve mechanisms 80 for discharging the cleaning liquid. Each exhaust valve mechanism 80 includes: a part to be contacted 81 disposed on the outer surface of the bottom plate 14; a valve member 82 capable of being air-tightly and water-tightly brought into contact with the part to be contacted 81; and a cylinder apparatus 84 having a piston rod 83 for driving the valve member 82. A drain port 85 is formed to pass through the part to be contacted 81 and the bottom plate 14. The control device 46 is connected to the cylinder apparatus 84, and the cylinder apparatus 84 is configured to drive the valve member 82 based on a control signal from the control device 46. The drain port 85 is located on a position directly below the base part 22 of the wafer board 20. Thus, the vibrator 30 can be attached to the outer surface of the bottom plate 14 of the cleaning tank 10 at a position corresponding to the wafers W, without being interfered with by the exhaust valve mechanisms 80. Accordingly, the wafers W can be reliably cleaned. In this embodiment, although the drain port 85 has a rectangular shape, the drain port 85 may have any optional shape such as a circular shape and so on. Further, the number of the exhaust valve mechanisms 80 disposed on each cleaning tank 10 is not limited to two, and the number thereof may be one or three or more.

As shown in FIGS. 2 and 3, the vibrator 30 of each cleaning tank 10 is composed of a plurality of vibrator units 31, and the vibrator units 31 are attached to the outer surface of the bottom plate 14 of each cleaning tank 10. Each of the vibrator units 31 is connected to constitute the vibrator 30 for every cleaning tank 10, and is connected to the output switch 50. The number of the vibrator units 31 to be disposed on each cleaning tank 10 may be one or other, as long as the vibrator units 31 can occupy positions corresponding to the wafers W held by the wafer board 20.

Next, the megasonic controller 40 is described with reference to FIG. 6. The megasonic controller 40 includes a single ultrasonic oscillator 41 configured to make the respective vibrators 30 ultrasonically vibrate, and the above-described control device 46 configured to control the ultrasonic oscillator 41 and the output switch 50.

The ultrasonic oscillator 41 includes: a main oscillator (oscillator body) 42 configured to send a radiofrequency drive power (a drive signal) to the vibrator 30 so as to make the vibrator 30 ultrasonically vibrate; and a plurality of matching units 43 (a first matching unit 43a and a second matching unit 43b) disposed between the main oscillator 42 and the output switch 50, the matching units being respectively configured to be suited for different vibrator impedances. The matching units 43 have predetermined impedances in order to effectively make the vibrators 30 ultrasonically vibrate. That is, the vibrators 30 attached to the respective cleaning tanks 10 have different vibrator impedances depending on their manufacturing precisions and attachment states. However, since the matching units 43 are interposed between the main oscillator 42 and the vibrators 30, it is possible to effectively make the vibrators 30 ultrasonically vibrate. A drive power source 44 configured to supply a low frequency power to the main oscillator 42 is connected to the main oscillator 42.

The control device 46 includes an oscillator part 47 that gives an instruction on frequency to the main oscillator 42, and the oscillator 47 is connected to the main oscillator 42 of the ultrasonic oscillator 41. Based on the instructed frequency from the oscillator part 47 of the control device 46, the main oscillator 42 is configured to convert a commercial frequency power to a radiofrequency drive power, and to send the radiofrequency drive power to the vibrator 30 via the output switch 50.

Between the main oscillator 42 and the respective matching units 43 of the ultrasonic oscillator 41, there is interposed a matching switch 45 that switches the matching unit 43 that is connected to the main oscillator 42. The control device 46 is connected to the matching switch 45, and the matching switch 45 is configured to switch the matching unit 43 that is connected to the main oscillator 42, based on a control signal from the control device 46.

Connected to the control device 46 is a measuring instrument 48 configured to measure vibrator impedances of the vibrators 30 of the respective cleaning tanks 10. The measuring instrument 48 is configured to measure a vibrator impedance of each vibrator 30, for every vibrator 30 to which the plurality of vibrator units 31 are connected. Based on the vibrator impedance previously measured by the measuring instrument 48, the control device 46 is configured to select, with respect to the vibrator 30 of each cleaning tank 10, the matching unit 43 suitable for the vibrator impedance of the vibrator 30, and to control the matching switch 45 such that, when the matching unit 43 selected for the vibrator 30 for generating the ultrasonic vibration is different from the matching unit 43 that is being connected to the main oscillator 42, the matching units 43 are switched.

Figure 7:
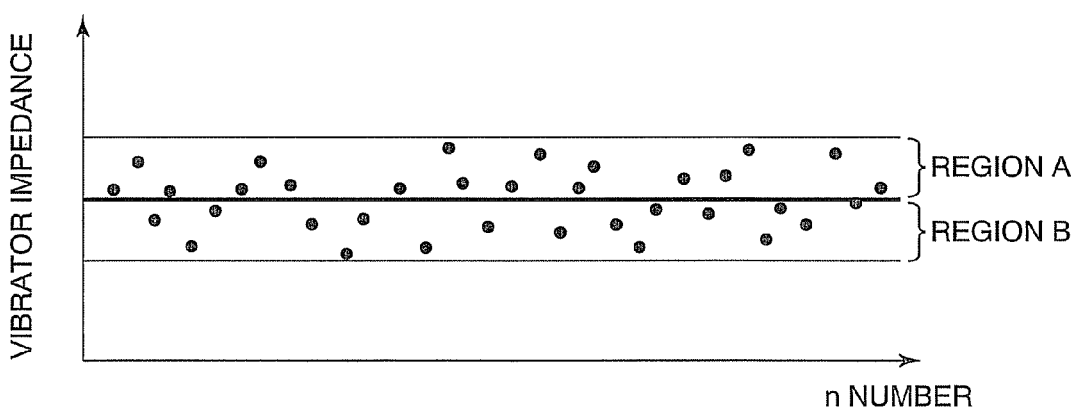
FIG. 7 is a view showing impedance ranges for which matching units can be suited in the embodiment according to the present invention.

As shown in FIG. 7, the respective matching units 43 have widths of the vibrator impedance for which the matching units 43 can be suited. Namely, the control device 46 is configured to select the first matching unit 43a when the vibrator impedance of the vibrator 30 for generating the ultrasonic vibration is included in a range A, and to select the second matching unit 43b when the vibrator impedance thereof is included in a range B. FIG. 7 shows a number of dots as examples of a vibrator impedance value of the vibrator 30 measured by the measuring instrument 48.

As described above, interposed between the ultrasonic oscillator 41 of the megasonic controller 40 and the vibrators 30 of the respective cleaning tanks 10 is the output switch 50 configured to switch the vibrator 30 that is connected to the ultrasonic oscillator 41. The control device 46 is connected to the output switch 50, and the output switch 50 is configured to switch the vibrator 30 that is connected to the ultrasonic oscillator 41, based on a control signal from the control device 46. In this manner, the control device 46 is configured to control (exclusively control) the ultrasonic oscillator 41 and the output switch 50, such that a timing at which the vibrator 30 of the one cleaning tank 10 is made ultrasonically vibrate, and a timing at which the vibrator of the other cleaning tank 10 is made ultrasonically vibrate are not overlapped with each other.

The control device 46 is configured to control the output switch 50 and the matching switch 45 such that the switching of the vibrators 30 and the switching of the matching units 43 are carried out simultaneously. Namely, the control device 46 is configured to control the matching switch 45 and the output switch 50 in a cooperative manner. Thus, the main oscillator 42 and the vibrator 30 can be quickly connected to each other.

In this embodiment, the control device 46 includes a computer, and the computer executes a program previously stored in a storage medium 49, whereby the cleaning of the wafers W using the ultrasonic cleaning apparatus 1 can be performed.

Figure 8:
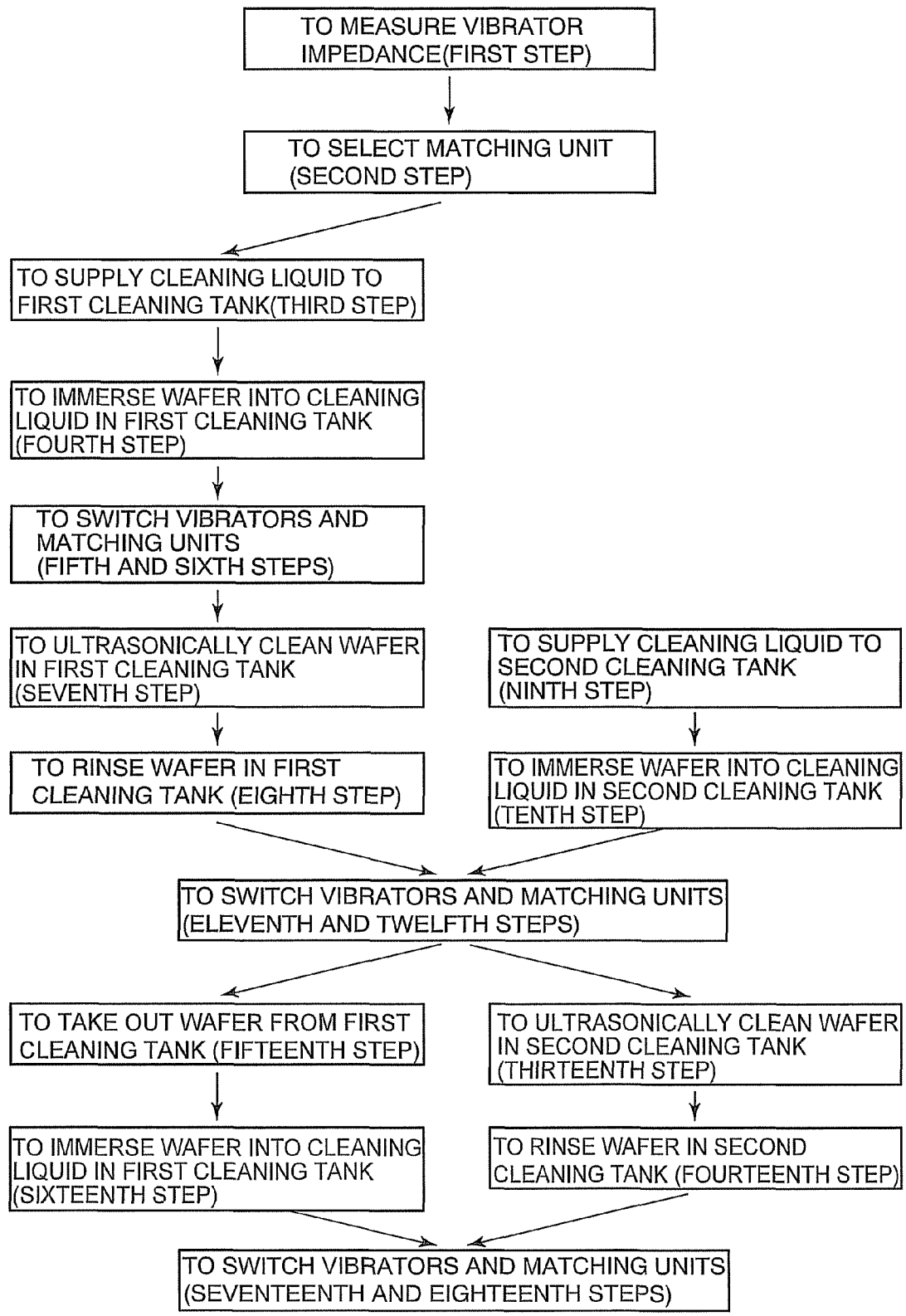
FIG. 8 is a flowchart showing an ultrasonic cleaning method in the embodiment according to the present invention.
Figure 9:
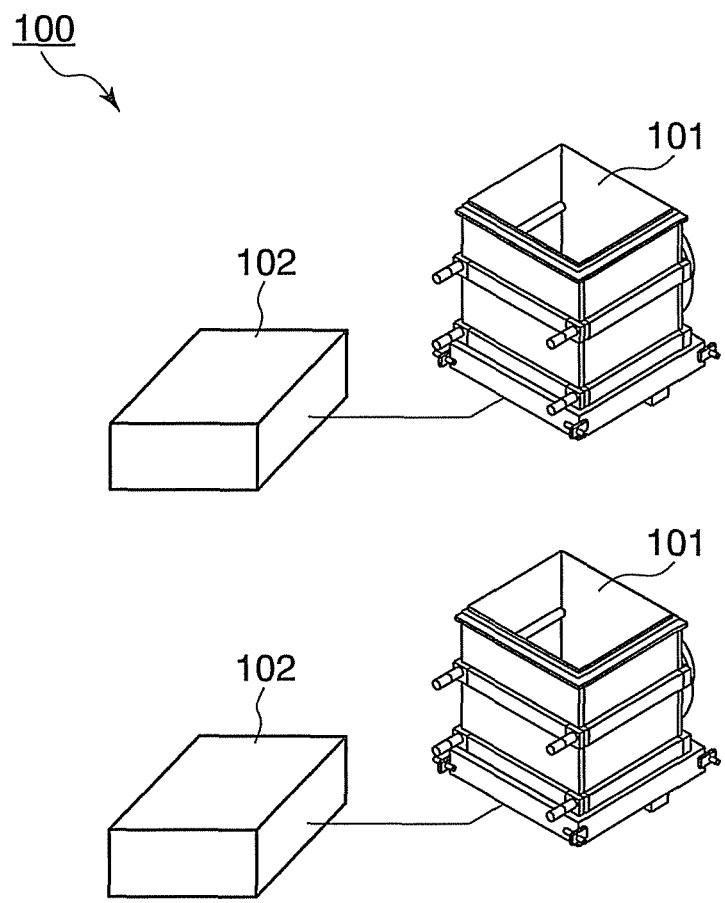
FIG. 9 is a schematic view showing an overall structure of a conventional ultrasonic cleaning apparatus.

Next, an operation of this embodiment as structured above, i.e., an ultrasonic cleaning method in this embodiment is described with reference to FIG. 8.

Figure 6:
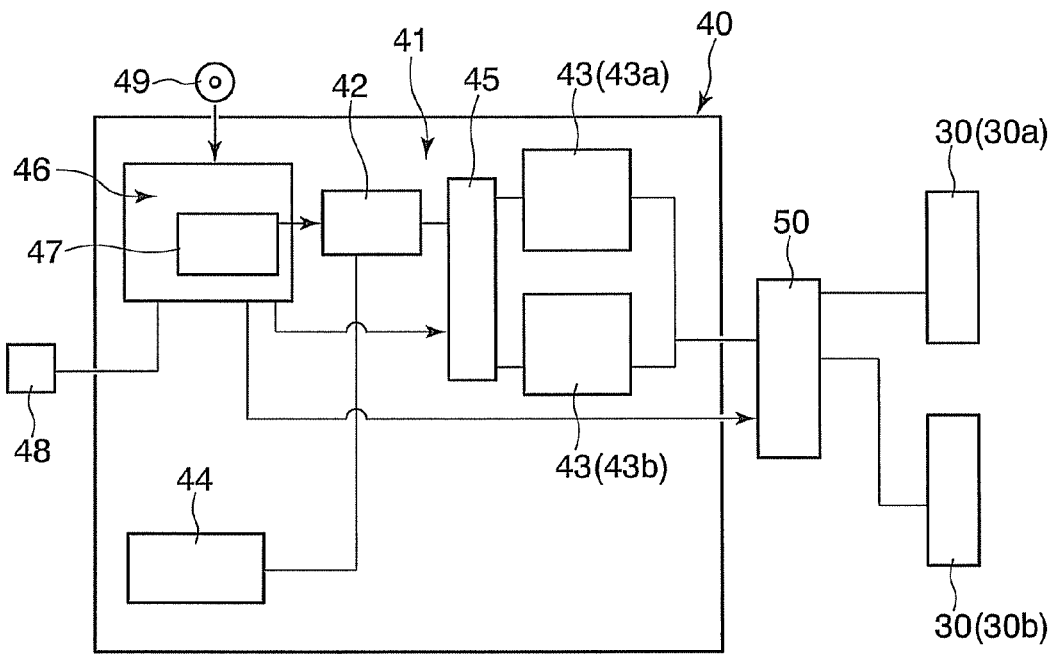
FIG. 6 is a view showing a structure of a megasonic controller in the embodiment according to the present invention.

As shown in FIG. 6, in the first place, vibrator impedances of vibrators 30 attached to the respective cleaning tanks 10 are measured by the measuring instrument 48 (a first step).

Then, with respect to the vibrator 30 of each cleaning tank 10, the matching unit 43 suitable for the vibrator impedance of the vibrator 30 is selected (a second step). In this case, based on the measured vibrator impedances of the vibrators 30, the matching unit 43 suitable for the vibrator impedance of each vibrator 30 is selected by the control device 46, and corresponding relationships between the vibrators 30 and the matching units 43 are stored. That is, when the measured vibrator impedance of the first impedance 30a is included in the range A shown in FIG. 7, for example, the first matching unit 43a is selected, and a corresponding relationship between the first vibrator 30a and the first matching unit 43a is stored. On the other hand, when the measured vibrator impedance of the second vibrator 30b is included in the range B shown in FIG. 7, for example, the second matching unit 43b is selected, and a corresponding relationship between the second vibrator 30b and the second matching unit 43b is stored.

Then, the cleaning liquid is supplied to one cleaning tank (hereinafter referred to as "first cleaning tank 10a") of the two cleaning tanks 10 (a third step). In this case, as shown in FIG. 2, the opening and closing valve 68 is opened based on a control signal from the control device 46, so that a deionized water is supplied from the deionized-water supply source 65 to the cleaning-liquid supply nozzles 61 via the selector valve 63. At this time, under the control of the control device 46, the selector valve 63 communicates the deionized-water supply pipe 64 to the cleaning-liquid supply pipe 62.

After the deionized water has been supplied, the chemical liquid pump 69 is driven based on a control signal from the control device 46, so that a chemical liquid is supplied from the chemical liquid reservoir 67 to the cleaning-liquid supply nozzles 61 via the selector valve 63. At this time, under the control of the control device 46, the selector valve 63 communicates the chemical-liquid supply pipe 66 to the cleaning-liquid supply pipe 62.

when a liquid surface of the stored cleaning liquid reaches the cut grooves 15 formed in the upper ends of the side walls 11 of the first cleaning tank 10a, the cleaning liquid outflows form the first cleaning tank 10a through the cut grooves 15. The outflowing cleaning liquid is collected by the pan (not shown) of the container 16 accommodating the first cleaning tank 10a, and is discharged outside the container 16 from the not-shown drain. Thereafter, the chemical liquid is continuously supplied from the chemical liquid reservoir 67.

Then, wafers W are immersed into the cleaning liquid in the first cleaning tank 10a (a fourth step). In this case, a plurality of, e.g., fifty wafers W, which have been transferred by a not-shown transfer mechanism, are engaged with the holding grooves 23 formed in the holding rods 21 of the wafer board 20 so as to be held by the holding rods 21. Then, the elevating mechanism (not shown) is driven based on a control signal from the control device 46, so that the holding rods 21 holding the wafers W are lowered and inserted into the first cleaning tank 10a. In this manner, the wafers W are immersed into the cleaning liquid.

After the wafers W have been immersed into the cleaning liquid in the first cleaning tank 10a, the vibrator 30 that is connected to the ultrasonic oscillator 41 is switched by the output switch 50 according to need (a fifth step). Namely, when the second vibrator 30b of a second cleaning tank 10b is being connected to the main oscillator 42, based on a control signal from the control device 46, the vibrator 30 that is connected to the main oscillator 42 is switched from the second vibrator 30b to the first vibrator 30a by the output switch 50.

Simultaneously with the fifth step, when the matching unit 43 selected for the vibrator 30 for generating the ultrasonic vibration is different from matching unit 43 that is being connected to the main oscillator 42, the matching unit 43 that is connected to the main oscillator 42 is switched (a sixth step). That is, when the second matching unit 43b is being connected to the main oscillator 42 of the ultrasonic oscillator 41, the control device 46 firstly sends a control signal to the matching switch 45, based on the stored corresponding relationship between the first vibrator 30a and the first matching unit 43a. After that, the matching unit 43 that is connected to the main oscillator 42 is switched from the second matching unit 43b to the first matching unit 43a by the matching switch 45.

Then, by sending a radiofrequency drive power (a drive signal) to the first vibrator 30a of the first cleaning tank 10a from the ultrasonic oscillator 41 via the output switch 50, the first vibrator 30a is made to ultrasonically vibrate, whereby the wafers W are ultrasonically cleaned (a seventh step). In this case, based on the instruction on frequency from the oscillator part 47 of the control device 46, the radiofrequency drive power is sent from the main oscillator 42 to the first vibrator 30a via the first matching unit 43a and the output switch 50. Thus, the first vibrator 30a can be effectively made to ultrasonically vibrate, whereby the cleaning efficiency of the wafers W can be improved.

During the ultrasonic vibration of the first vibrator 30a, the ultrasonic vibration is transmitted through the bottom plate 14 of the first cleaning tank 10a so as to be propagated to the cleaning liquid. Thus, particles adhering to the wafers W can be removed. For this while, the chemical liquid is continuously supplied into the first cleaning tank 10a. Therefore, the particles which have been removed from the wafers W and float on the liquid surface of the cleaning liquid can be allowed to outflow from the cut grooves 15 of the first cleaning tank 10a, together with the overflowing cleaning liquid. Accordingly, the cleaning liquid can be maintained clean, whereby the cleaning efficiency of the wafers W can be enhanced.

After the wafers W have been ultrasonically cleaned for a predetermined period of time, the wafers W in the first cleaning tank 10a are subjected to a rinse process (an eighth step). In this case, the chemical liquid pump 69 is firstly stopped, so that the supply of the chemical liquid to the first cleaning tank 10a is stopped. Then, the control device 46 opens the opening and closing valve 68 and actuates the selector valve 63, so that a deionized water is supplied from the deionized-water supply source 65 to the first cleaning tank 10a. Thereafter, in the same manner as that of the above seventh step, the first vibrator 30a is made to ultrasonically vibrate, so that the ultrasonic vibration is propagated to the cleaning liquid.

During the third to eighth steps being carried out, the cleaning liquid is supplied to the other cleaning tank (hereinafter referred to as "second cleaning tank 10b") (a ninth step), in the same manner as that of the third step. Wafers W are immersed into the cleaning liquid in the second cleaning tank 10b (a tenth step), in the same manner as that of the fourth step.

After the wafers W have been immersed into the cleaning liquid in the cleaning tank 10b, the vibrator 30 that is connected to the ultrasonic oscillator 41 is switched by the output switch 50 (an eleventh step). In this case, based on a control signal from the control device 46, the vibrator 30 that is connected to the main oscillator 42 is switched from the first vibrator 30a of the first cleaning tank 10a to the second vibrator 30b of the second cleaning tank 10b by the output switch 50.

Simultaneously with the eleventh step, when the matching unit 43 selected for the vibrator 30 for generating the ultrasonic vibration is different from matching unit 43 that is being connected to the main oscillator 42, the matching units 43 are switched (a twelfth step). In this embodiment, as described above, since the first matching unit 43a is selected for the first vibrator 30a, and the second matching unit 43b is selected for the second vibrator 30b, the matching units 43 are switched. In this case, based on the stored corresponding relationship between the second vibrator 30b and the second matching unit 43b, the control device 46 firstly sends a control signal to the matching switch 45. Thereafter, the matching unit 43 that is connected to the main oscillator is switched from the first matching unit 43a to the second matching unit 43b by the matching switch 45.

When the first matching unit 43a is selected as the matching unit 43 suitable for the vibrator impedance of the second vibrator 30b, no control signal is sent from the control device 46 to the matching switch 45, and thus the matching units 43 are not switched.

Then, by sending a radiofrequency drive power to the second vibrator 30b of the second cleaning tank 10b from the ultrasonic oscillator 41 via the output switch 50, the second vibrator 30b is made to ultrasonically vibrate, so that the wafers W are ultrasonically cleaned (a thirteenth step). In the thirteenth step, the wafers W are ultrasonically cleaned in the same manner as that of the above seventh step.

Thereafter, the wafers W in the second cleaning tank 10b are subjected to the rinse process (a fourteenth step), in the same manner as that of the above eighth step.

During the thirteenth and fourteenth steps being carried out, the following step is carried out in the first cleaning tank 10a. Namely, the wafers W immersed in the cleaning liquid are taken out from the first cleaning tank 10a (a fifteenth step). In this case, based on a control signal from the control device 46, the elevating mechanism of the wafer board 20 is driven, so that the holding rods 21 holding the wafers W are elevated. Then, the wafers W are taken out from the first cleaning tank 10a, and are transferred from the holding rods 21 to the not-shown transfer mechanism.

Thereafter, wafers W are immersed into the cleaning liquid in the cleaning tank 10a (a sixteenth step), in the same as that of the fourth step.

After the wafers W have been immersed into the cleaning liquid in the first cleaning tank 10a, the vibrator 30 that is connected to the ultrasonic oscillator 41 is switched by the output switch 50 (a seventeenth step). In the seventeenth step, the vibrator that is connected to the main oscillator 42 of the ultrasonic oscillator 41 is switched from the second vibrator 30b to the first vibrator 30a, in the same manner as that of the above eleventh step.

Simultaneously with the seventeenth step, the matching unit 43 that is connected to the main oscillator 42 of the ultrasonic oscillator 41 is switched (an eighteenth step). In the eighteenth step, the matching unit 43 that is connected to the main oscillator 42 is switched from the second matching unit 43b to the first matching unit 43a, in the same manner as that of the above twelfth step.

Following thereto, by suitably repeating the above steps, the wafers W can be sequentially, ultrasonically cleaned in the first cleaning tank 10a and the second cleaning tank 10b.

The cleaning liquid in the first cleaning tank 10a and the second cleaning tank 10b is replaced according to need. For example, as shown in FIG. 5, when the cleaning liquid in the cleaning tank 10a is replaced, based on a control signal from the control device 46, the cylinder apparatus 84 of the exhaust valve mechanism 80 is driven, so that the valve member 82 is drawn apart from the part to be contacted 81. Thus, the cleaning liquid is discharged through the drain port 85, whereby the cleaning liquid in the cleaning tank 10a can be discharged for a short period of time. After the cleaning liquid has been discharged, the cylinder apparatus 84 is driven so that the valve member 82 is brought into contact with the part to be contacted 81. Thus, the part to be contacted 81 and the valve member 82 maintain air-tightness and water-tightness therebetween. Thereafter, the cleaning liquid is supplied to the first cleaning tank 10a, in the same manner as that of the above third step. In this manner, the cleaning liquid is replaced.

According to this embodiment, the output switch 50 is controlled by the control device 46, so that the vibrator 30 that is connected to the single ultrasonic oscillator 41 is switched to the vibrator 30 to be connected thereto. Thus, the vibrator 30 of one of the two cleaning tanks 10 can be made to ultrasonically vibrate by the single ultrasonic oscillator 41. That is to say, the wafers W can be ultrasonically cleaned in the respective cleaning tanks 10a and 10b, such that a timing at which the first vibrator 30a of the first cleaning tank 10a is made to ultrasonically vibrate, and a timing at which the second vibrator 30b of the second cleaning tank 10b is made to ultrasonically vibrate are not overlapped with each other. As a result, one of the vibrators 30 of the two cleaning tanks 10 can be made to ultrasonically vibrate by the single ultrasonically oscillator 41, whereby the ultrasonic cleaning apparatus 10 including the two cleaning tanks 10 can be downsized, and a price thereof can be decreased.

The above-described embodiment can be variously modified within a scope of the present invention. Typical modifications will be described herebelow.

In the above embodiment, the ultrasonic oscillator 41 includes the first matching unit 43a and the second matching unit 43b. However, not limited thereto, the ultrasonic oscillator 41 may include three or more matching units 43. In this case, the more suitable matching unit 43 can be selected for the vibrator impedance of the vibrator 30 attached to each cleaning tank 10, whereby the vibrator 30 can be more effectively made to ultrasonically vibrate.

In addition, in the above embodiment, the two cleaning tanks 10 are installed. However, the present invention can be applied to a case in which three or more cleaning tanks 10 are installed, and the vibrators 30 are disposed on the respective cleaning tanks 10.

In addition, in the above embodiment, each cleaning tank 10 is accommodated in the container 16, and the pan for collecting the cleaning liquid outflowing from the cleaning tank 10 is disposed on the bottom part of the container 16. However, not limited thereto, each cleaning tank 10 may include an inner tank in which the cleaning liquid is stored, and an outer tank by which the cleaning liquid overflowing from the inner tank is collected. In this case, a circulation path for supplying the cleaning liquid to a cleaning-liquid supply nozzle, which is provided in the inner tank, may be connected to the outer tank. Alternatively, the outer tank may be provided with an exhaust valve mechanism for discharging the cleaning liquid.

In addition, in the above embodiment, the two cleaning-liquid supply nozzles 61 are disposed in each cleaning tank 10. However, not limited thereto, as shown in FIG. 1, the four cleaning-liquid supply nozzles 61 may be disposed.

In addition, in the above embodiment, the bottom plate 14 of each cleaning tank 10 is made of amorphous carbon or silicon carbide. The thickness of the bottom plate 14 is relatively larger (e.g., 6.5 mm), and the vibrator 30 is directly attached to the bottom plate 14. However, not limited thereto, the thickness of the bottom plate 14 may be smaller, and the vibrator 30 may be attached to the bottom plate 14, with a stainless reinforcing plate excellent in acoustic transmission being sandwiched between the bottom plate 14 and the vibrator 30. Also in this case, the ultrasonic waves from the vibrator 30 can be effectively transmitted.

In addition, in the above embodiment, the vibrator 30 is attached to the bottom plate 14 of each cleaning tank 10. However, not limited thereto, the vibrator 30 may be attached to the lateral part or the upper part of each cleaning tank 10. Also in this case, the wafers W can be reliably ultrasonically cleaned in each cleaning tank 10.

In addition, in the above embodiment, the vibrator 30 is directly attached to the bottom plate 14 of the cleaning tank 10. However, not limited thereto, an additional tank (not shown), which stores a deionized water such that at least the bottom part of the cleaning tank 10 is immersed therein, may be disposed below the cleaning tank 10, and the vibrator 30 may be disposed on a bottom part of the additional tank. In this case, the ultrasonic vibration generated by the vibrator 30 can be propagated to the cleaning tank 10 via the deionized water in the additional tank, and the wafers W can be reliably ultrasonically cleaned in the cleaning tank 10.

Although some modifications of the embodiment are independently described, the aforementioned modifications may be suitably combined.

As described above, the ultrasonic cleaning apparatus 1 is equipped with the control device 46 including the computer. The respective components of the ultrasonic cleaning apparatus 1 are actuated by the control device 46, such that the cleaning of the wafers W is performed. The present invention also provides the storage medium 49 storing a program executable by the computer of the control device 46, in order to perform the cleaning of the wafers W with the use of the ultrasonic cleaning apparatus 1. The storage medium 49 may be a memory such as a ROM or a RAM, or the disc-shaped storage medium 49 such as a hard disc or a CD-ROM.

In the above description, the ultrasonic cleaning apparatus 1 of the present invention, the ultrasonic cleaning method, and the storage medium 49 storing the computer program for executing the ultrasonic cleaning method, are applied to the cleaning process of the semiconductor wafers W. However, not limited thereto, the present invention can be applied to cleaning of various substrates such as LCD substrates or CD substrates.

The invention claimed is:

1. An ultrasonic cleaning apparatus comprising:
a plurality of cleaning tanks configured to store a cleaning liquid;
an object-to-be-processed holder capable of being inserted into each cleaning tank, the object-to-be-processed holder being configured to hold an object to be processed and to immerse the object to be processed into the cleaning liquid;
a vibrator disposed on each cleaning tank;
a single ultrasonic oscillator configured to make each vibrator ultrasonically vibrate;
an output switch interposed between the ultrasonic oscillator and the vibrator of each respective cleaning tank, the output switch being configured to switch the vibrator that is connected to the ultrasonic oscillator; and
a control device configured to control the ultrasonic oscillator and the output switch;
wherein the control device controls the ultrasonic oscillator and the output switch such that a timing at which the vibrator of one of the cleaning tanks is made to ultrasonically vibrate, and a timing at which the vibrator of another cleaning tank is made to ultrasonically vibrate, are not overlapped with each other.

2. The ultrasonic cleaning apparatus according to claim 1, wherein:
the ultrasonic oscillator includes: an oscillator body; a plurality of matching units disposed between the oscillator body and the output switch, the matching units being respectively configured to be suited for different vibrator impedances; and a matching switch interposed between the oscillator body and the respective matching units, the matching switch being configured to switch the matching unit that is connected to the oscillator body; and
the control device is configured to select, with respect to the vibrator of each cleaning tank, the matching unit suitable for the vibrator impedance of the vibrator, and to control the matching switch such that, when the matching unit selected for the vibrator for generating ultrasonic vibration is different from the matching unit that is being connected to the oscillator body, the matching units are switched.

3. The ultrasonic cleaning apparatus according to claim 2, wherein
the control device is configured to control the output switch and the matching switch such that the switching of the vibrators and the switching of the matching units are simultaneously carried out.

4. The ultrasonic cleaning apparatus according to claim 2, further comprising a measuring instrument configured to measure the vibrator impedance of the vibrator of each cleaning tank,
wherein the control device is configured to select the suitable matching unit based on the vibrator impedance measured by the measuring instrument.

5. An ultrasonic cleaning method comprising:
cleaning an object to be processed immersed in a cleaning liquid in one cleaning tank of a plurality of cleaning tanks, by sending a drive signal from a single ultrasonic oscillator via an output switch to a vibrator of the one cleaning tank of the plurality of cleaning tanks on which the vibrator is disposed so as to make the vibrator ultrasonically vibrate; and
cleaning an object to be processed immersed in a cleaning liquid in another cleaning tank, by sending a drive signal from the ultrasonic oscillator via the output switch to the vibrator of the other cleaning tank so as to make the vibrator ultrasonically vibrate;
wherein the objects to be processed are cleaned such that a timing at which the vibrator of the one cleaning tank is made to ultrasonically vibrate, and a timing at which the vibrator of the other cleaning tank is made to ultrasonically vibrate, are not overlapped with each other.

6. The ultrasonic cleaning method according to claim 5, wherein:
the ultrasonic oscillator includes: an oscillator body; and a plurality of matching units disposed between the oscillator body and the output switch, the matching units being respectively configured to be suited for different vibrator impedances; and
the ultrasonic cleaning method further comprises:
selecting, with respect to the vibrator of each cleaning tank, the matching unit suitable for the vibrator impedance of the vibrator; and
switching the matching unit that is connected to the oscillator body when the matching unit selected for the vibrator for generating ultrasonic vibration is different from the matching unit that is being connected to the oscillator body; and
after the matching units have been switched, the object to be processed is cleaned by making the vibrator ultrasonically vibrate.

7. The ultrasonic cleaning method according to claim 6, wherein
the switching of the vibrators and the switching of the matching units are simultaneously carried out.

8. The ultrasonic cleaning method according to claim 6, further comprising measuring the vibrator impedance of the vibrator of each cleaning tank,
wherein when the matching unit is selected, the suitable matching unit is selected based on the measured vibrator impedance.

9. A storage medium storing a computer program for executing an ultrasonic cleaning method which comprises:
cleaning an object to be processed immersed in a cleaning liquid in one cleaning tank of a plurality of cleaning tanks, by sending a drive signal from a single ultrasonic oscillator via an output switch to a vibrator of the one cleaning tank of the plurality of cleaning tanks on which the vibrator is disposed so as to make the vibrator ultrasonically vibrate; and
cleaning an object to be processed immersed in a cleaning liquid in another cleaning tank, by sending a drive signal from the ultrasonic oscillator via the output switch to the vibrator of the other cleaning tank so as to make the vibrator ultrasonically vibrate;
wherein the objects to be processed are cleaned such that a timing at which the vibrator of the one cleaning tank is made to ultrasonically vibrate, and a timing at which the vibrator of the other cleaning tank is made to ultrasonically vibrate, are not overlapped with each other.

* * * * *